US006583031B2

United States Patent
Lin

(10) Patent No.: US 6,583,031 B2
(45) Date of Patent: Jun. 24, 2003

(54) METHOD OF MAKING A MEMS ELEMENT HAVING PERPENDICULAR PORTION FORMED FROM SUBSTRATE

(75) Inventor: Chuang-Chia Lin, San Pablo, CA (US)

(73) Assignee: Onix Microsystems, Inc., Richmond, CA (US)

( * ) Notice: Subject to any disclaimer, the term of this patent is extended or adjusted under 35 U.S.C. 154(b) by 0 days.

(21) Appl. No.: 09/915,217

(22) Filed: Jul. 25, 2001

(65) Prior Publication Data

US 2003/0049879 A1 Mar. 13, 2003

(51) Int. Cl.$^7$ .................... H01L 21/30; H01L 21/46
(52) U.S. Cl. .................... 438/459; 438/29; 438/69; 257/415; 257/619
(58) Field of Search .................... 438/7–9, 16, 27, 438/29, 42, 65, 69, 459; 257/415, 619

(56) References Cited

U.S. PATENT DOCUMENTS

| | | | |
|---|---|---|---|
| 5,043,404 A | 8/1991 | Howe et al. | 21/306 |
| 5,206,983 A | 5/1993 | Guckel et al. | 29/598 |
| 5,314,572 A | 5/1994 | Core et al. | 156/643 |
| 5,327,033 A | 7/1994 | Guckel et al. | 310/40 |
| 5,576,250 A | 11/1996 | Diem et al. | 437/228 |

(List continued on next page.)

FOREIGN PATENT DOCUMENTS

| | | | |
|---|---|---|---|
| EP | 0605300 | 7/1994 | G01P/15/08 |
| EP | 0942462 | 9/1999 | H01L/21/311 |
| EP | 1033601 | 6/2000 | G02B/26/02 |
| EP | 1120677 | 8/2001 | G02B/26/02 |
| GB | 2321780 | 8/1998 | H01L/37/02 |
| WO | 0057233 | 9/2000 | G02B/26/00 |

OTHER PUBLICATIONS

Yao et al., "Single Crystal Silicon Supported Thin Film Micro Mirrors for Optical Applications" Opt. Eng. 36(5) 1408–1413 (May 1997).

(List continued on next page.)

Primary Examiner—John F. Niebling
Assistant Examiner—Lynne A Gurley
(74) Attorney, Agent, or Firm—JDI Patent; Joshua D. Isenberg

(57) ABSTRACT

A microelectromechanical systems (MEMS) element, MEMS optical switch and MEMS fabrication method are described. The MEMS element comprises a crystalline and moveable element is moveably attached to the substrate. The moveable element includes a perpendicular portion oriented substantially perpendicular to a plane of the substrate. The crystal structure of the perpendicular portion and substrate are substantially similar. The moveable element moveable is moveably attached to the substrate for motion substantially constrained to a plane oriented substantially perpendicular to a plane of the substrate. In at least one position, a part of a perpendicular portion of the moveable element projects beyond a surface of the substrate. The moveable element may be retained in place by a latch. The perpendicular portion may be formed substantially perpendicular portion to the substrate. An array of such structures can be implemented to work as an optical switch. The optical switch may comprise a crystalline substrate and one or more moveable elements moveably attached to the substrate. The MEMS elements may be fabricated by providing a substrate; forming one or more trenches in the substrate to define a perpendicular portion of a element; and moveably attaching the moveable element to a first surface of the substrate; removing a portion of the substrate such that at least a part of the perpendicular portion projects beyond a second surface of the substrate. The various embodiments provide for a robust and reliable MEMS elements that may be simply fabricated and densely packed.

6 Claims, 10 Drawing Sheets

U.S. PATENT DOCUMENTS

| | | | |
|---|---|---|---|
| 5,629,918 A | 5/1997 | Ho et al. .................... 369/112 |
| 5,637,539 A | 6/1997 | Hofmann et al. ............. 438/20 |
| 5,638,946 A | 6/1997 | Zavracky .................... 200/181 |
| 5,645,684 A | 7/1997 | Keller ..................... 156/643.1 |
| 5,717,631 A | 2/1998 | Carley et al. ............... 365/174 |
| 5,719,073 A | 2/1998 | Shaw et al. ................. 437/228 |
| 5,770,465 A | 6/1998 | MacDonald et al. .......... 437/67 |
| 5,780,885 A | 7/1998 | Diem et al. ................. 257/254 |
| 5,866,281 A | 2/1999 | Guckel et al. ................ 430/22 |
| 5,908,719 A | 6/1999 | Guckel et al. ................. 430/5 |
| 5,914,507 A | 6/1999 | Polla et al. ................. 257/254 |
| 5,943,155 A | 8/1999 | Goossen ..................... 359/247 |
| 5,949,571 A | 9/1999 | Goossen et al. ............ 359/291 |
| 5,960,255 A | 9/1999 | Bartha et al. ................ 438/14 |
| 5,971,355 A | 10/1999 | Biegelsen et al. ..... 251/129.06 |
| 6,021,675 A | 2/2000 | Sefeldt et al. ................ 73/777 |
| 6,025,951 A | 2/2000 | Swart et al. ................ 359/245 |
| 6,074,890 A | 6/2000 | Yao et al. ..................... 438/52 |
| 6,121,552 A | 9/2000 | Brosnihan et al. .......... 174/253 |
| 6,203,715 B1 | 3/2001 | Kim et al. .................... 216/24 |
| 6,362,512 B1 * | 3/2002 | Kubby et al. ............... 257/415 |
| 6,379,989 B1 * | 4/2002 | Kubby et al. ................. 438/29 |
| 6,389,189 B1 * | 5/2002 | Edwards et al. ............. 385/18 |
| 6,404,942 B1 * | 6/2002 | Edwards et al. ............. 385/18 |
| 2002/0075554 A1 * | 6/2002 | Brophy et al. .............. 359/291 |

OTHER PUBLICATIONS

Conant et al. "A Flat High Frequency Scanning Micromirror" Abstract Submitted to Hilton Head 2000.

Storment et al. "Flexible Dry Release Process for Aluminum Electrostatic Actuators" Journal of Microelectromechanical System vol. 3 No. 3 Sep. 1994.

Mita et al., "An Out-of-Plane Polysilicon Actuator With a Smooth Vertical Mirror for Optical Fiber Switch Application".

Marxer et al. "Vertical Mirrors Fabricated by Deep Reactive Ion Etching For Fiber–Optic Switching Applications" Journal of Microelectrcomechanical Systems, vol. 6 No. 3, Sep. 1997.

Fedder, G.K., "integrated microelectromechanical systems in conventional CMOS", Proceedings of 1997 IEEE International Symposium on Circuits and Systems. Circuits and Systems in the Information Age. ISCAS '97 (Cat. No. 97CH35987), pp. 2821–2824, vol. 4.

Provisional Patent Application of Behrang Behin et al., "Global Mechanical Stop for Precise Positioning of a Field of Mirrors", filed Mar. 9, 1999.

L. Y. Lin, et al, Free Space Micromachined Optical Switches with Submillisecond Switching Time for Large–Scale Optical Crossconnects, IEEE Photonics Technology Letters, vol. 10, No. 4, Apr. 1998.

U.S. patent application Ser. No. 09/489,264 of Robert L. Wood et al., "MEMS Optical Cross–Connect Switch", filed Jan. 20, 2000.

* cited by examiner

METHOD OF MAKING A MEMS ELEMENT HAVING PERPENDICULAR PORTION FORMED FROM SUBSTRATE

CROSS-REFERENCE TO RELATED APPLICATION

This application is a divisional of prior application entitled "MEMS ELEMENT HAVING PERPENDICULAR PORTION FORMED FROM SUBSTRATE", by Chuang-Chia Lin, Ser. application No. 09/915,232, filed Jul. 23, 2001, which is incorporated herein by reference.

FIELD OF THE INVENTION

This invention relates generally to microelectromechanical structures (MEMS). More particularly, it relates to MEMS elements.

BACKGROUND OF THE INVENTION

MEMS free-space optical switches can be categorized into two major branches: the planar matrix (2-dimensional) approach, and the beam-steering (3-dimensional) approach. The 2-dimensional approach typically involves mirrors that move between two positions (on and off). The 3-dimensional approach requires precise "analog" control mirror position through a wide angle to steer the beam.

In a conventional 2-dimensional approach, the MEMS switching components, such as rotating mirrors may be formed from a substrate using standard photolithography techniques. The mirrors are typically formed in the plane of the substrate and rotate out of plane into an "ON" or up-position to steer the beam because the light beam typically travels parallel to the substrate. Only the position accuracy at the "ON" or up-position is critical as it determines the alignment accuracy and optical loss. In the "OFF" or down-position, the mirror position can be "coarsely" controlled. To align the mirrors in the up-position a two-chip approach is often used. A "top chip" is formed having openings with perpendicular sidewalls. The openings align with the mirrors formed on a "bottom chip." A "top chip" having openings with almost perfectly perpendicular sidewalls may be formed, e.g., by etching a <110>-silicon wafer with an anisotropic etchant. When the "top" chip is properly aligned and bonded to the "bottom chip," the sidewalls of the openings can serve as reference stopping planes to fix the up-position of the mirrors. In addition, the sidewalls may also serve as electrodes to hold the mirrors in the up-position electrostatically. Unfortunately, the fabrication and alignment can be complicated, which reduces the yield of useful devices and correspondingly increases their cost.

It is desirable to orient the mirror in the "on" position as fabricated. Typically, the mirrors are formed as a layer on a wafer, parallel to the wafer surface. If the mirrors are "on" at this position, one needs to form an out-of-plane array unless many wafers are stacked. It is very difficult to build such an array. Therefore, the solution is to build mirror plates oriented perpendicular to the wafer surface. One approach to making mirrors perpendicular to the wafer surface is to fold polysilicon mirrors out-of-plane. In this approach, the mirrors are formed in-plane and may be folded and latched out-of-plane by hand using a probe. This is extremely labor intensive and the accuracy is questionable as it relies on a mechanical clamp or latch to fix the mirror in the on position. Alternatively, a micro-actuator may be used to fold the mirrors out of plane. However, the space required for a capable actuator is often somewhat larger than the mirror. Consequently, the device density, an important factor, is severely compromised.

An article by Cornel Marxer et al., titled "Vertical Mirrors Fabricated by Deep Reactive Ion Etching for Fiber-Optic Switching Applications" published in the Journal of Microelectromechanical Systems, Vol. 6, No. 3, September 1997, describes the fabrication of a vertically oriented MEMS mirror from a single crystal substrate. The electrostatically actuated MEMS mirror slides horizontally, i.e., parallel to the plane of the substrate, to implement a 2×2 crossbar switch. Two pairs of optical fibers are positioned in a cross (+) shaped configuration with the MEMS mirror located at the intersection of the cross. In a "cross" state, the MEMS mirror is retracted from in between the fibers. In the "cross" state optical signals may traverse the space between the fibers in a straight path from one fiber to a directly opposing fiber. In an "add/drop" state, the mirror is interposed between the fibers to deflect optical signals by 90 from one fiber to a perpendicularly opposing fiber. Unfortunately, the switch of Marxer et al. cannot be readily scaled up to implement switches having large planar arrays of mirrors. Specifically the actuator used to move the mirror occupies space that limits the pitch or minimum spacing between mirrors.

Thus, there is a need in the art, for an optical switch having MEMS elements that overcomes he above disadvantages and a corresponding method of making it.

SUMMARY OF THE INVENTION

The disadvantages associated with the prior art are overcome by embodiments of the present invention directed to a microelectromechanical systems (MEMS) element. According to an embodiment of the invention, the MEMS element comprises a crystalline substrate having a crystal structure characterized by two or more substrate crystal axes. A moveable element is moveably attached to the substrate. The moveable element includes a perpendicular portion oriented substantially perpendicular to a plane of the substrate. The perpendicular portion of the moveable element has a crystal structure characterized by one or more moveable element crystal axes. The crystal structure of the perpendicular portion of the moveable element is substantially the same as the crystal structure of the substrate. When the moveable element is in at least one position, two or more of the moveable element crystal axes are oriented substantially parallel to two or more corresponding substrate crystal axes. In at least one position, a part of a perpendicular portion of the moveable element projects beyond a surface of the substrate. The moveable element may be retained by a latch.

In accordance with another embodiment of the present invention, A MEMS element may comprise a substrate and a moveable element. The moveable element is moveably attached to the substrate for motion substantially constrained to a plane oriented substantially perpendicular to a plane of the substrate. The moveable element has a perpendicular portion that is formed from the material of the substrate. The perpendicular portion is formed substantially perpendicular to the substrate. In at least one position, a part of a perpendicular portion of the moveable element projects beyond a surface of the substrate.

In accordance with another embodiment of the invention, an optical switch may comprise a crystalline substrate and one or more moveable elements moveably attached to the substrate. The substrate has a crystal structure characterized by two or more substrate crystal axes. Each moveable element includes a perpendicular portion oriented substantially perpendicular to a plane of the substrate. The perpendicular portion of each moveable element has a crystal structure characterized by one or more moveable element crystal axes. The crystal structure of each perpendicular portion is substantially the same as the crystal structure of the substrate. When a given moveable element is in at least one position, two or more of the moveable element crystal axes for the given element are oriented substantially parallel to two or more corresponding substrate crystal axes. In at least one position, a part of a perpendicular portion of each moveable element projects beyond a surface of the substrate.

Another embodiment of the present invention provides a method for making a microelecromechanical systems (MEMS) element. The method comprises providing a substrate; forming one or more trenches in the substrate to define a perpendicular portion of a element; and moveably attaching the moveable element to a first surface of the substrate; removing a portion of the substrate such that at least a part of the perpendicular portion projects beyond a second surface of the substrate.

The various embodiments of the present invention provide for a MEMS elements that are robust, reliable and may be densely packed. MEMS elements according to embodiments of the present invention exhibit a simple design that does not require a lengthy fabrication process. The design assures high yield and improved device performance. Fabrication turnaround time can be also reduced to improve throughput.

BRIEF DESCRIPTION OF THE DRAWINGS

The teachings of the present invention can be readily understood by considering the following detailed description in conjunction with the accompanying drawings, in which:

FIGS. 1M–1P depict schematic diagrams of a MEMS element having a latch;

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

A novel MEMS element has a vertical plate that can be precisely clamped. The plate may be made free of release holes that are common to MEMS mirrors. The plate may be made optically flat, and can move or rotate into a substrate. Also, the MEMS element may be made without requiring long slender hinges, a typical reliability culprit. Another common issue stiction may be reduced significantly also due to a much smaller contact area. An array of such MEMS can be easily converted into a planar optical switch fabric for directing optical beams in a communications network.

This design may be realized by forming the plate out of a single crystal substrate, e.g., <110> silicon with anisotropic etchant. The plate is oriented substantially perpendicular to a plane of the substrate. The plate is attached to a clamp plate to form a T-beam. When clamped to the substrate, the mirror is at ON position and the clamp plate fixes its angle. This angle will be repeatable from mirror to mirror because all mirrors may be formed by etching the same crystal. As a result, each plate has the same crystal structure as the substrate. When the plate is in the ON position, the crystal axes of the plate are substantially aligned with the crystal axes of the substrate.

Figure 1A:
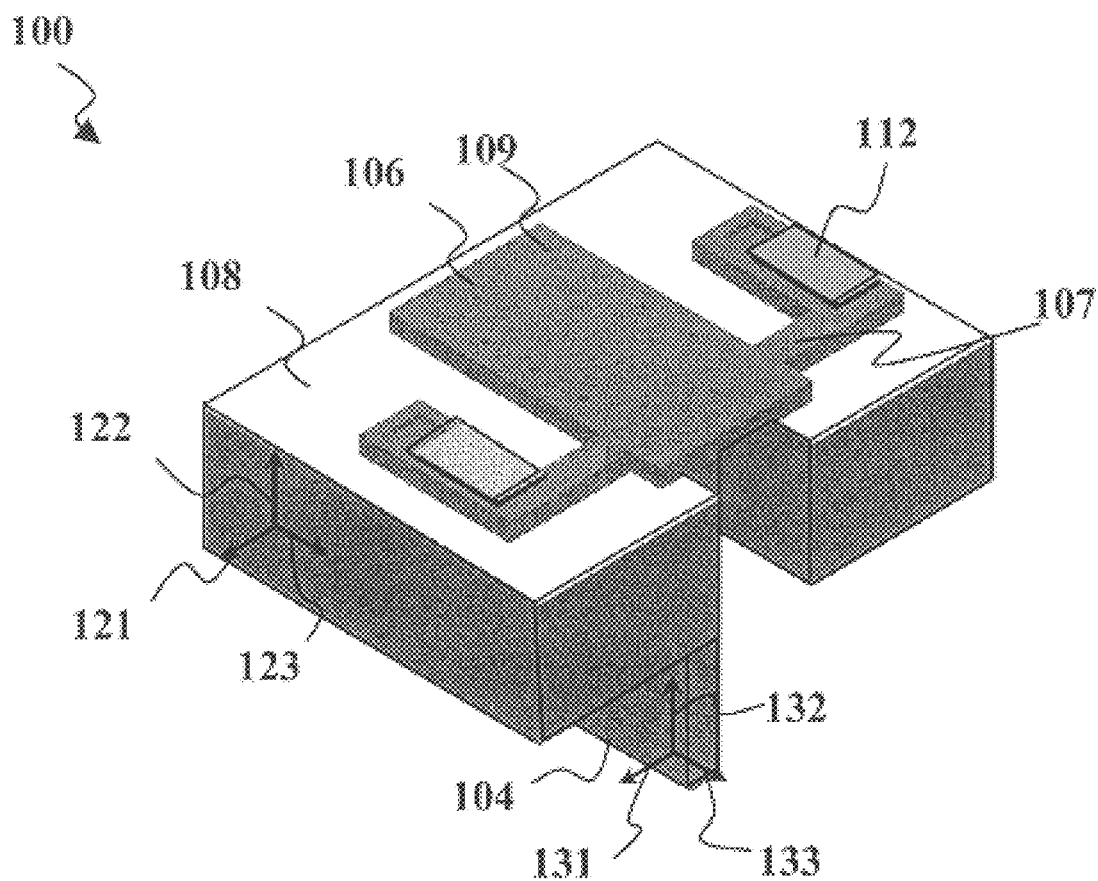
FIG. 1A is an isometric schematic diagram showing a backside view of a MEMS element according a first embodiment of the invention.
Figure 1B:
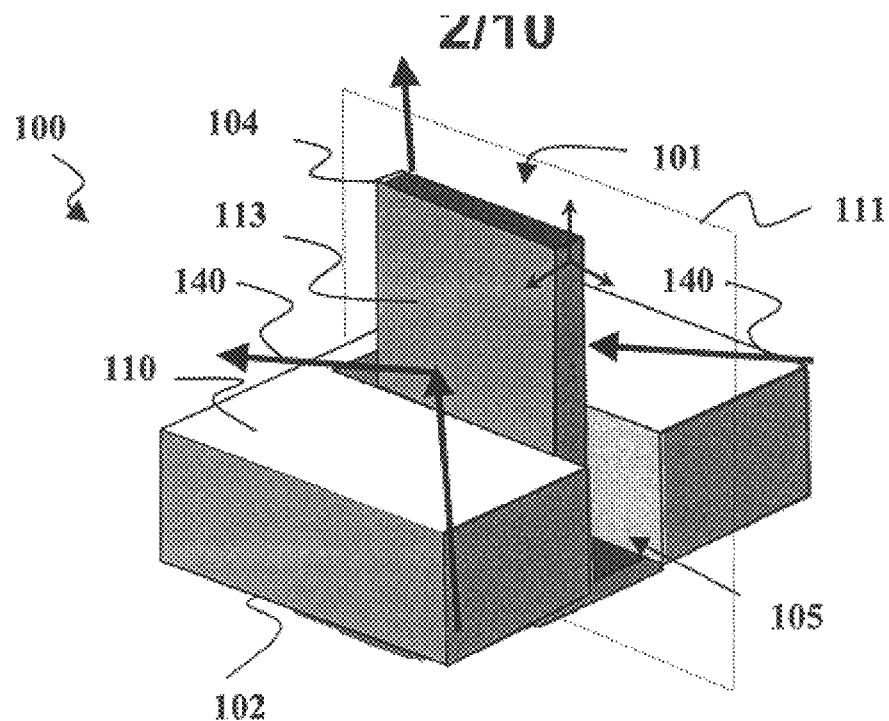
FIG. 1B is an isometric schematic diagram showing a frontside view of the MEMS element of FIG. 1A where a moveable element in a first position.
Figure 1C:
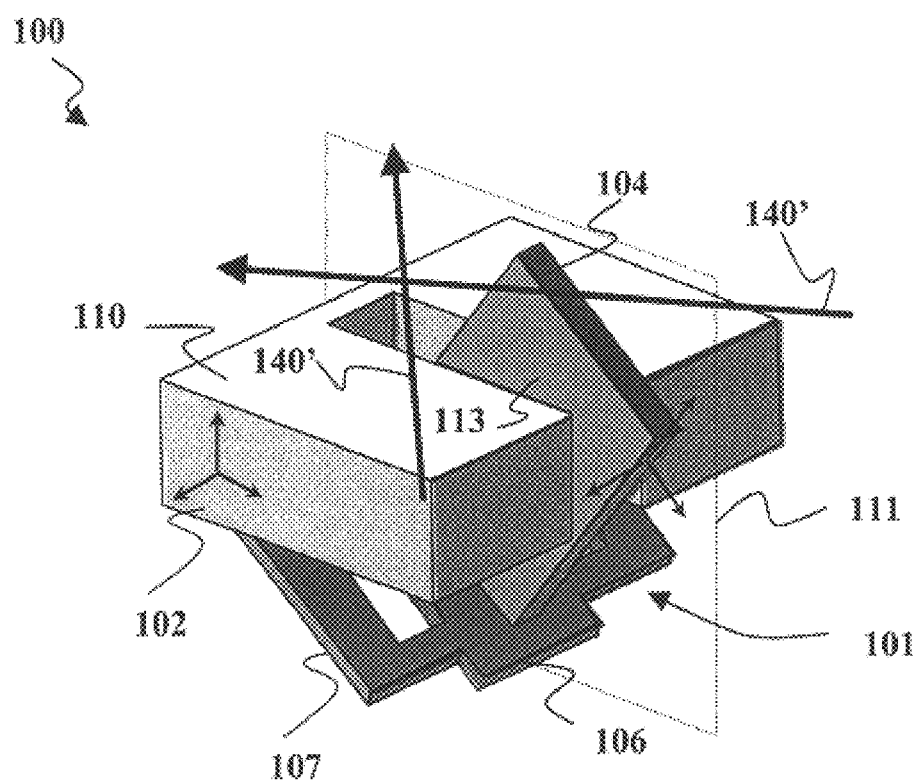
FIG. 1C is an isometric schematic diagram showing another frontside view of the MEMS element of FIG. 1A where the moveable element in a second position.

An example of a MEMS element 100 according to a first embodiment of the invention is depicted in FIGS. 1A–1C. The MEMS element 100 generally includes a substrate 102 and a moveable element 101, By way of example, the substrate 102 may be a crystalline substrate having a crystal structure characterized by substrate crystal axes 121, 122, 123. An example of a suitable single crystalline substrate is silicon. The moveable element 101 is moveably attached to a first surface 108 of the substrate 102; e.g., by a clamping plate 106 and one or more flexures 107. The moveable element 101 may be disposed within a slot 105 in the substrate 102 for movement with respect to the substrate 102. The moveable element 101 includes a perpendicular portion 104 that is attached to the clamping plate 106. The perpendicular portion 104 projects partly beyond a second surface 110 of the substrate 102. The perpendicular portion 104 is oriented substantially perpendicular to a plane of the substrate 102. As used herein, the plane of the substrate 102 may be regarded as any plane parallel to the a surface of the substrate 102, e.g. a plane parallel to the first surface 108 or the second surface 110. The perpendicular portion 104 has a crystal structure characterized by moveable element crystal axes 131, 132, 133. The perpendicular portion 104 may be formed from the substrate 102 such that the crystal structure of the perpendicular portion 104 of the moveable element 101 is substantially the same as the crystal structure of the substrate 102.

The moveable element 101 is moveable with respect to the substrate 102 between a first position and a second position. In the embodiment depicted in FIGS. 1A–1C, the motion of the moveable element is substantially constrained to motion in a plane 111 that is oriented perpendicular to the plane of the substrate 102. The moveable element may move between the first and second positions by rotation in the plane 111, by translation in the plane 111, or by some combination of rotation and translation within the plane 111. In the first position, depicted in FIG. 1B, the moveable portion intercepts the path of one or more optical signals 140. A light-deflecting component 113 of the perpendicular portion 104 of the moveable element 101 deflects the optical signals 140. By way of example, the light-deflecting component 113 may be a simple plane reflecting (or partially reflecting) coating on the sides of the perpendicular portion 104. In the example shown in FIGS. 1A–1C, the reflective coating covers both sides of the perpendicular portion 104 so that the moveable element 101 may reflect optical signals 140 that travel in two different directions. Alternatively, the light-deflecting component may be curved reflecting (or partially reflecting) surface, prismatic reflector, refractive element, prism, lens, waveguide, diffractive element, e.g. fresnel lens, a dichroic coated surface for wavelength specific and bandpass selectivity, or some combination of these. When the moveable element 101 is in the first position, two or more of the moveable element crystal axes, e.g. axes 131, 132, 133 are oriented substantially parallel to two or more corresponding substrate crystal axes, e.g., axes 121, 122, 123. In the second position, depicted in FIG. 1C, the moveable element 101 does not intercept one or more optical signals 140'. In the example depicted in FIGS. 1A–1C, the movable element 101 rotates and translates between the first and second positions. A slot 105 in the substrate 102 receives the perpendicular portion 104 and permits rotation relative to the substrate 102. Alternatively, the moveable element 101 may translate between the first and second positions. Such translation may be either parallel to the plane of the substrate 102 or perpendicular to the plane of the substrate 102. Note that independent of whether the movable element 101 is in the first position, the second position, or some intermediate position, the perpendicular portion 104 always remains substantially perpendicular to the plane of the substrate 102.

Figure 1D:
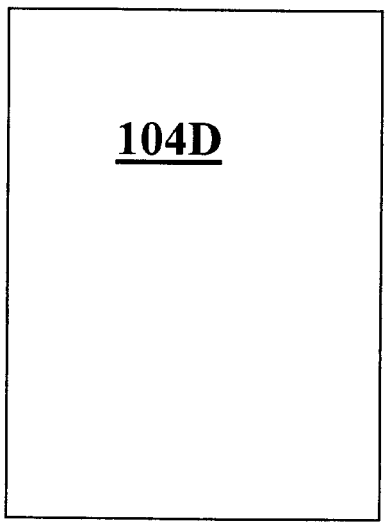
FIGS. 1D–1G depict schematic diagrams of different possible shapes for a portion of the moveable element.
Figure 1E:
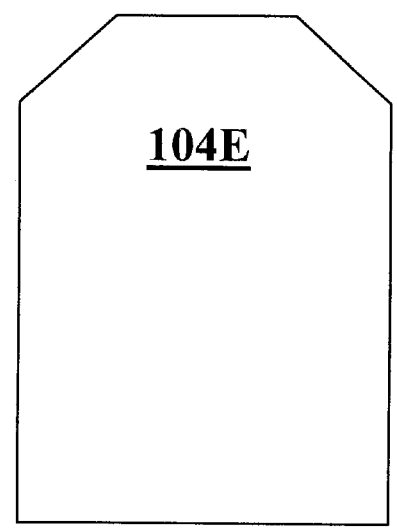
Figure 1F:
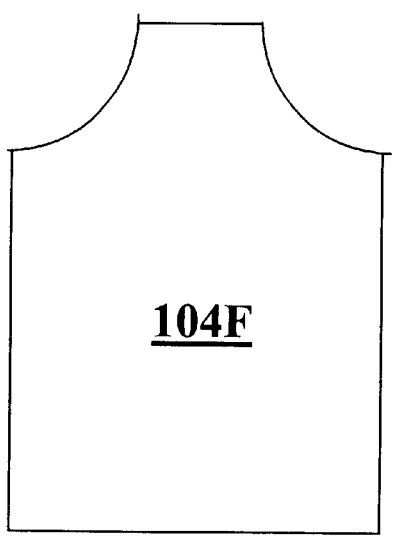
Figure 1G:
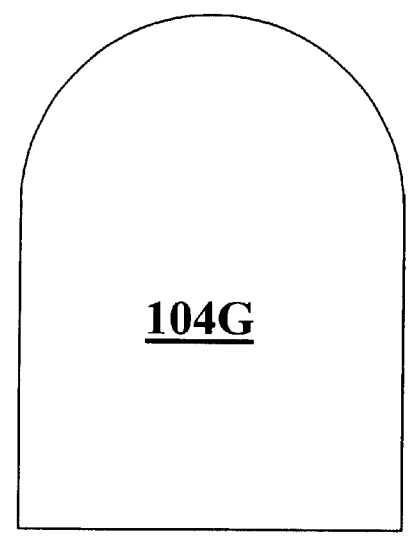

The perpendicular portion of the moveable element 101 may have any suitable shape. FIGS. 1D–1G depict examples of possible shapes. FIG. 1D depicts a perpendicular portion 104D having a substantially rectangular shape. FIG. 1E depicts a perpendicular portion 104E having a substantially rectangular shape with one or more clipped corners. The corners may be clipped e.g., using an axis-selective etching process. FIG. 1F depicts a perpendicular portion 104F having a substantially rectangular shape having arcuate sections removed from one or more corners. The arcuate sections may be formed, e.g. by an isotropic etch process. FIG. 1G depicts a perpendicular portion 104G having a substantially rectangular shape with one or more rounded corners. The shapes of the perpendicular portions depicted in FIGS. 1E, 1F and 1G reduce the angular displacement of the respective perpendicular portions 104E, 104F and 104G to translate between the first and second positions.

Although MEMS elements of the types depicted above may be used in optical switching systems, the present invention is in no way limited to such applications. MEMS elements of the types described herein may be used in biomedical applications, for example, in microvalves that require precise positioning. Furthermore, such MEMS elements may find application in micro-relays, passive radiofrequency (RF) devices such as tunable capacitors and the like.

There are many methods to actuate the moveable element 101 with the essential goal of pulling the perpendicular portion 104 into the substrate 102 by moving it with respect to the plane of the substrate 102. A magnetic material may be deposited onto the clamping plate 106 to allow the moveable element 101 to be driven by external magnetic field. Alternatively, another substrate, with electrodes, may be attached to the substrate 102. A voltage applied between the electrodes and the clamping plate 106 may produce an electrostatic force that pulls the moveable element. These two methods can use a mechanical restoring torque generated by a torsion hinge as the hinge 107 such that only one-way actuation is required. However, the rotation angle may be made much smaller than with mirrors formed in the plane of the substrate. Therefore, a stiffer and more robust torsion hinge may be used, which improves device reliability and manufacturability.

Figure 1H:
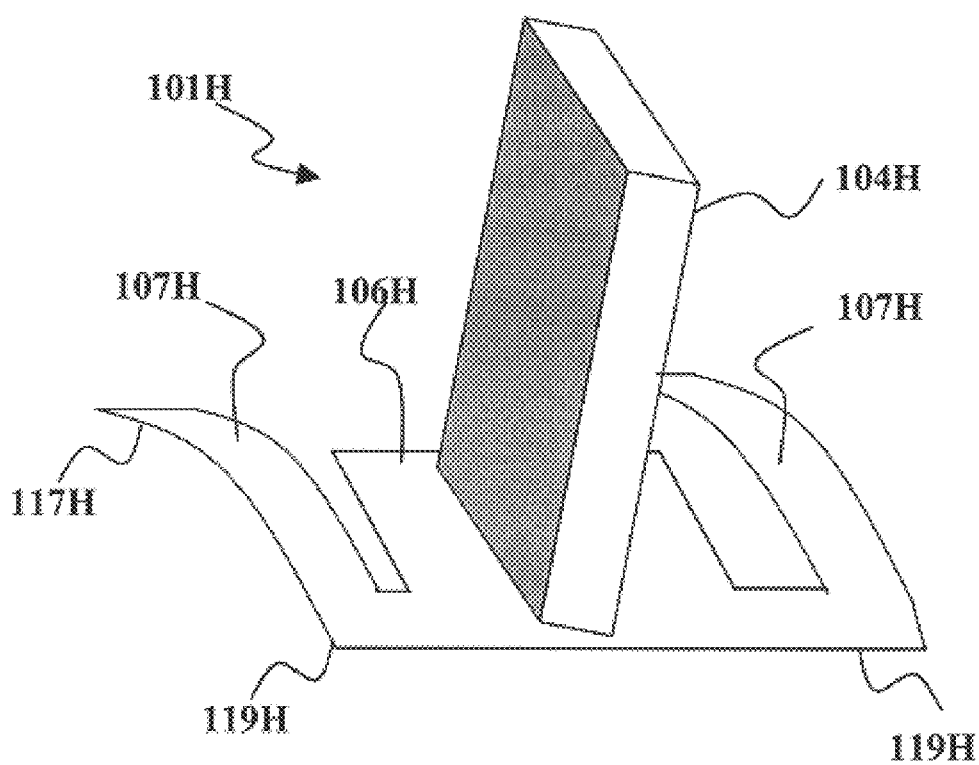
FIGS. 1H–1L depict schematic diagrams of different actuation schemes for the moveable element.
Figure 1I:
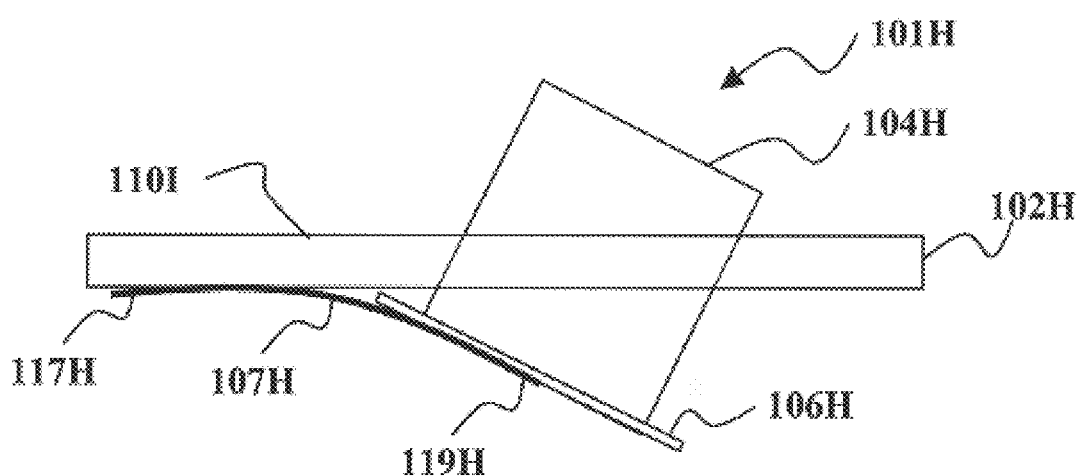

The actuation mechanism may be incorporated into the flexures 107. For example, the moveable element 101 may be actuated with a pre-stressed flexure such as a thermal bimorph actuator or electrostatic actuator. FIGS. 1H–1I depict schematic diagrams that illustrate an example of a moveable element 101H that utilizes pre-stressed flexure. The moveable element 101H generally includes a perpendicular portion 104H a clamping plate 106H and a pre-stressed flexure 107H. The pre-stressed flexure 107H is attached at a first end 117H to a substrate 102H. A second end 119H of the pre-stressed flexure 107H is free to move. By way of example, the pre-stressed flexure 107H may utilize a bimorph element having two materials with different residual stress. The different stress levels bend the bimorph material causes the second end 119H of the pre-stressed flexure 107H to curl away from the substrate 102H when the second end 119H is released. If these two materials have different coefficients of thermal expansion, heat may be applied to the pre-stressed flexure 107H (e.g., through a microresistive heater) to pull it and the rest of the moveable element 101H back toward the substrate 102H. Alternatively, the bimorph can be built such that the layer next to the substrate 102H is electrically insulative. A voltage applied between the substrate and the other layer generates an electrostatic force that pulls the moveable element 101H back toward the substrate 102H. In either case, the motion of the moveable element 101H may be described as a combination of translation and rotation with respect to the substrate 102H.

Figure 1J:
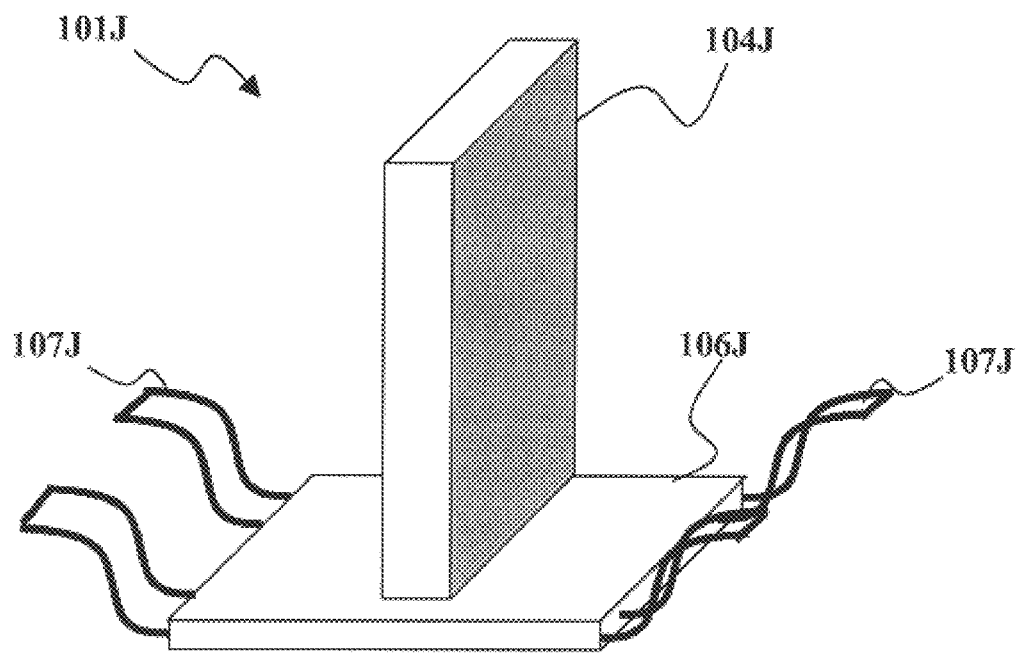
Figure 1K:
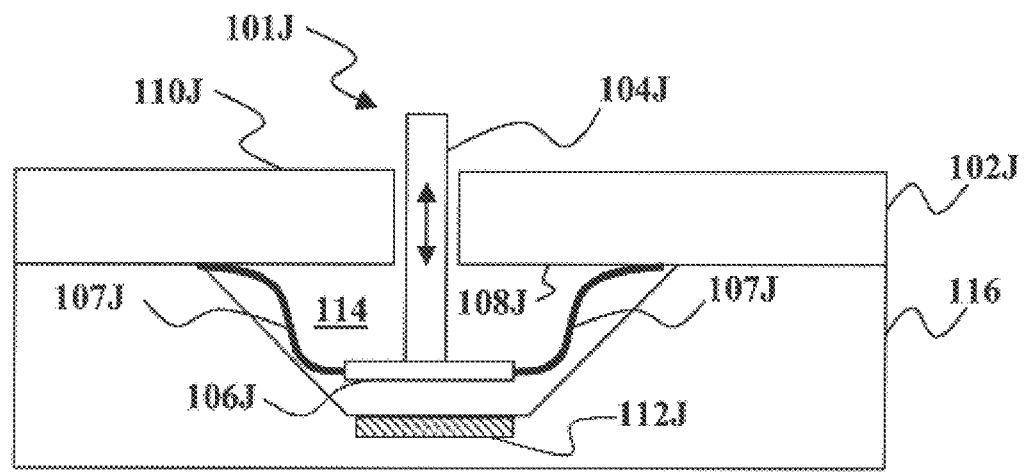

A variation on the pre-stressed actuator of FIGS. 1H–1I is depicted in FIGS. 1J–1K. In this variation, a moveable element 101J includes a perpendicular portion 104J attached to a clamping plate 106J and one or more elastically deformable flexures 107J, such as springs, serpentine flexures or polymer flexures. The pre-stressed flexures 107J are attached to opposite ends of the clamping plate 106J and to a first surface 108J of the substrate 102J. This configuration of pre-stressed flexures 107J facilitates translation of the moveable element 101H perpendicular to the substrate 102J. In at least one position, a part of the perpendicular portion 104J of the moveable element 101J projects beyond a second surface 110J of the substrate 102J. The moveable element 101J may also be actuated under the influence of an electrostatic or magnetic force. An electrostatic force may be exerted by applying an electric voltage between the clamping plate 106J and an electrode 112J. The electrode 112J may be disposed on a secondary substrate 116 that is attached to the substrate 102 as shown in FIG. 1K. A magnetic force may be exerted by applying an external magnetic field to a magnetic material (not shown) attached to the clamping plate 106J. The secondary substrate 116 may include a recess 114 that accommodates the movement of the moveable element 101J and the flexures 107J.

Figure 1L:
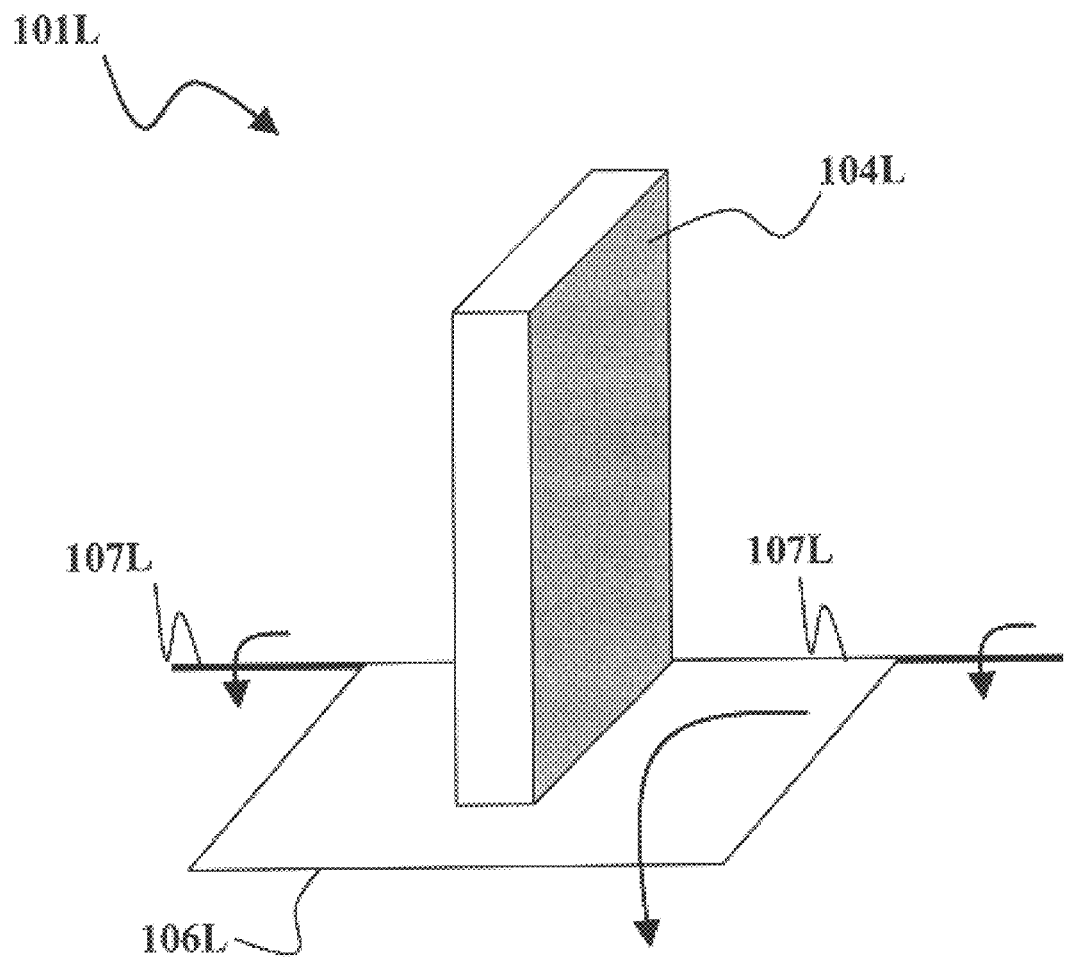

An actuation scheme that uses torsional hinge flexures is depicted in FIG. 1L. In this variation, a moveable element 101L includes a perpendicular portion 104L attached to a clamping plate 106L and one or more torsional hinge flexures 107L. The torsional hinge flexures 107L are attached to opposite ends of the clamping plate 106L and define an axis of rotation. The free ends of the torsional hinge flexures 107L may be attached to a substrate such as the substrate 102 of FIGS. 1A–1C. The torsional hinge flexures 107L apply a torsional, or restoring force that returns the moveable element 101L to the second position when an actuating force is removed. However, other restoring forces may be applied to moveable element 101L to return the flap to the second position. Such forces may be exerted on moveable element 101L by biasing mechanisms that operate via electrostatic, pneumatic, thermal, or magnetic principals, including coils that interact with an external magnetic field, electrostatic elements, such as gap closing electrodes, piezoelectric actuators, stress bearing elements and thermal actuators. Multiple restoring forces may also used together, and the forces may operate along the same or opposing directions.

An additional variation on the first embodiment of the present invention provides a latch for retaining the moveable element in the first position. FIGS. 1M–1P depict a MEMS element 100M that uses such a latch. The MEMS element 100M generally includes a substrate 102M a moveable element 101M and a latch 150. The moveable element includes a perpendicular 104M portion attached to a clamping plate 106M. The clamping pate 106M is attached to a first surface 108M of the substrate 102M by one or more flexures 107M. The flexures 107M may be any of the types described above. The flexures 107M permit the moveable element to move as shown by the curved arrows. In at least one position, a part of the perpendicular portion 104M of the moveable element 101M projects beyond a second surface 110M of the substrate 102M. In the first position, depicted in FIG. 1P, the perpendicular element may intercept an optical signal 140M. In the first position the clamping plate 106M is substantially parallel to the first surface of the substrate 102M and the perpendicular element 104M is substantially perpendicular to a second surface 110M of the substrate 102M. In a second position, depicted in FIG. 1N the perpendicular element is moved out of the path of an optical signal 140M.

Figure 1M:
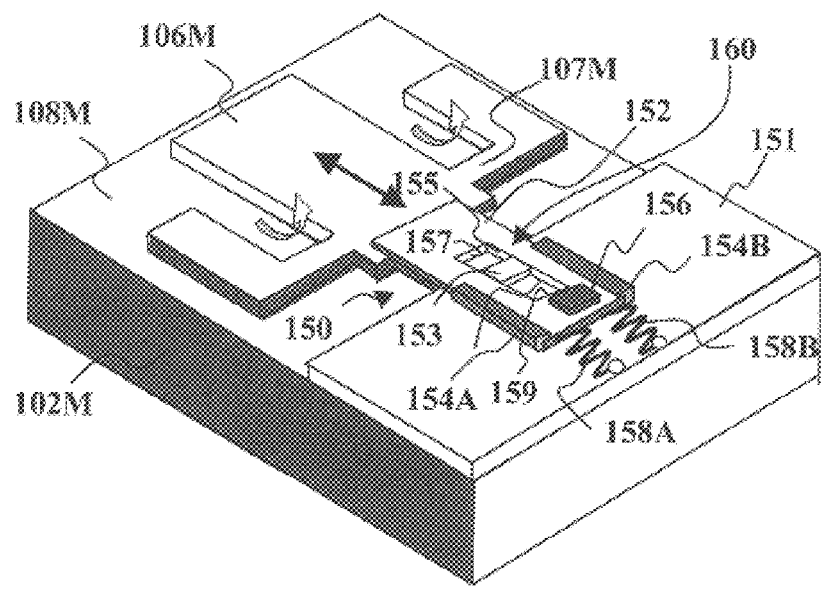
Figure 1N:
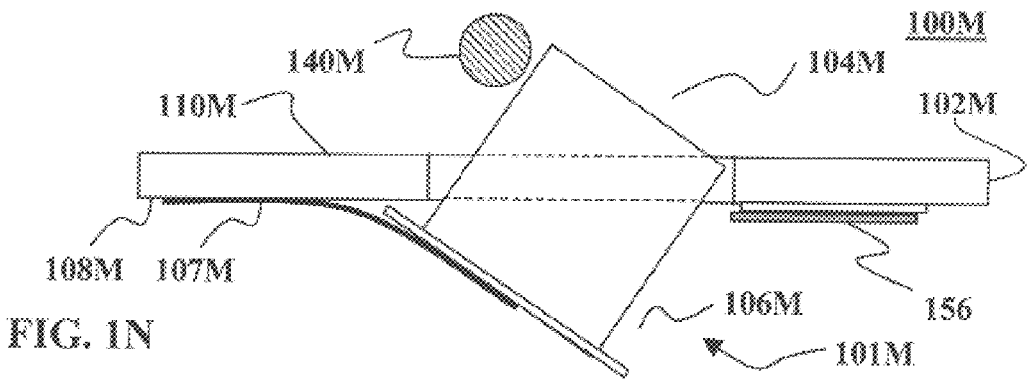

The latch 150 retains the moveable element 101M in the first position. By way of example, and without loss of generality, the latch 150 may include a latch plate 152, guides 154A, 154B, an actuator 156 and one or more optional springs 158A, 158B. The latch plate 152 slides parallel to the substrate 102M to engage the clamping plate 106M. The guides 154A, 154B constrain the motion of latch plate 152 to a lateral motion in substantially a single dimension. The latch plate 152 and guides 154A, 154B are disposed on a raised portion 151 of the substrate 102M. The latch plate 152 may include a stop 160 that restricts the range of the lateral motion of the latch plate 152. By way of example, the stop 160 may be implemented as a projection 153 that engages a slot 155. The projection 153 is attached to the raised portion 151 and restricts the lateral motion of the latch plate 152 by engaging either a first end 157 or a second end 159 of the slot 155. It should be pointed out that the implementation of the stop 160 that is depicted in FIG. 1M is merely one example of many possible stop configurations. Consequently, the invention should not be construed as being limited to this particular configuration.

The actuator 156 provides a force for selectively moving the latch plate 152 into or out of engagement with the clamping plate 106M. By way of example, the actuator 156 may be a magnetic material that interacts with a magnetic field. The actuating force may alternatively be provided by an actuator operating by electrostatic, pneumatic, piezoelectric, thermal bimorph or other principles. The optional springs 158A, 158B may be attached at one end to the raised portion 151 to urge the latch plate 152 towards the clamping plate 106M and force the latch plate 152 against the projection 153. The springs 158A, 158B thus provide a restoring force on the latch plate 152, such that the actuator 156 is only required to exert a force to move the latch out of engagement with the clamping plate 106M.

The latch 150 is advantageous in MEMS elements that apply an actuating force to move the moveable element 101M into the first position. The latch 150 mechanically retains the moveable element 101M in the first position so that the actuating force may be turned off. This is particularly advantageous if the actuating force involves the use of an electromagnet. The electromagnet may be turned off, and therefore, need not consume power, while the moveable element is retained in the first position by the latch 152. If the flexure 107M biases the moveable element in the second position, the electromagnet need only be turned on to move the moveable element 101M from the second position to the first position. Thus, power consumption may be substantially reduced and the configuration moveable element 101M may be preserved in the event of a power failure. Preserving the state of the moveable element 101M is particularly useful where two or more moveable elements are arrayed together in a MEMS device. If each moveable element is provided with a latch, such as the latch 160, the state of the state of the array, i.e., the set of individual states of each moveable element, may be preserved in the event of a power failure.

Figure 2:
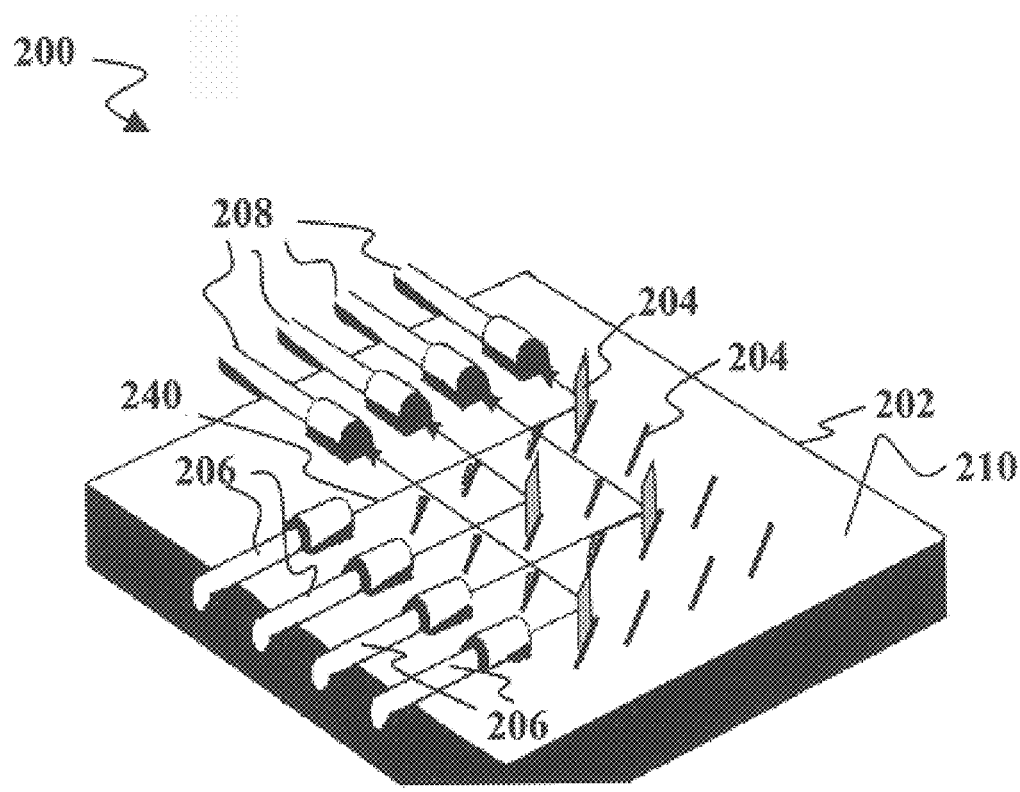
FIG. 2 is an isometric schematic diagram of an optical switch according to a second embodiment of the invention.

A second embodiment of present invention includes systems that incorporate two or more MEMS elements of the type described above with respect to FIGS. 1A–1C, e.g. arranged in an array. Such an array is depicted in the form of an optical switch 200 of FIG. 2. The optical switch 200 generally comprises a crystalline substrate 202 and an array of moveable elements 204 oriented substantially perpendicular to a plane of the substrate 202. The moveable elements have features in common with MEMS elements the type depicted in FIGS. 1A–1C. Specifically, each element 204 has a crystal structure characterized by one or more moveable element crystal axes. The crystal structure of each moveable element 204 is substantially the same as the crystal structure of the substrate 202. When a given moveable element is in at least one position, two or more of the moveable element crystal axes for the given element are oriented substantially parallel to two or more corresponding substrate crystal axes.

The moveable elements 204 include light-deflecting portions that selectively couple optical signals 240 between one or more input fibers 206 and one or more output fibers 208. In the example of the second embodiment shown in FIG. 2, the moveable elements translate perpendicular to a plane of the substrate 202 between a first position and a second position. In the first position, part of a perpendicular portion of a given moveable element projects beyond a surface 210 of the substrate so that the moveable element 204 intercepts the optical signal 240 to deflect it. In the second position, the given moveable element translates into a slot 205 is the substrate 202 to allow the optical signal 240 to bypass without deflection. Although the moveable elements 204 depicted in the optical switch 200 of FIG. 2 translate to electively deflect the optical signals 240, the moveable elements may alternatively move in a manner similar to that depicted in any of FIGS. 1B–1P.

Figure 1P:
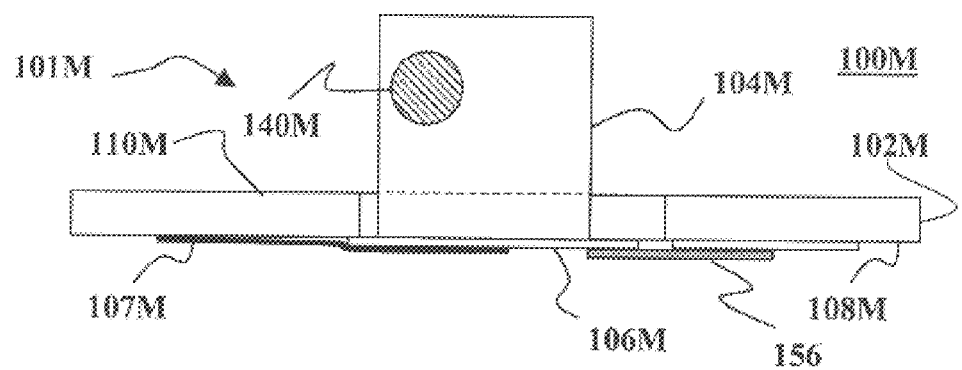

According to a third embodiment of the invention MEMS elements, such as elements of the types depicted in FIGS. 1A–1P, may be fabricated according to an inventive process. According to the method a substrate is provided and one or more trenches are formed in the substrate to define a moveable element. The moveable element is moveably attached to a first surface of the substrate. A portion of the substrate is removed such that at least a portion of the moveable element projects beyond a second surface of the substrate.

Figure 3:
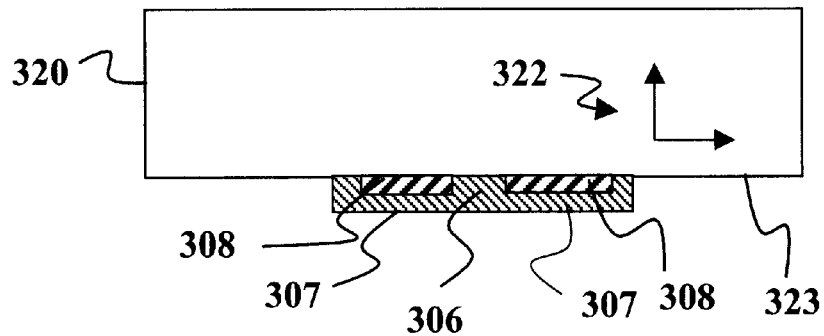
FIG. 3 depicts a series of cross sectional diagrams illustrating a method of fabricating a MEMS element according to a third embodiment of the invention.
Figure 3:
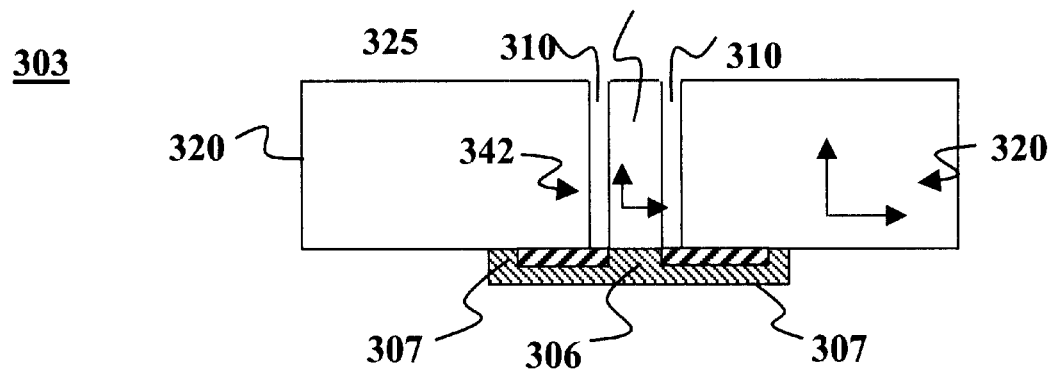
Figure 3:
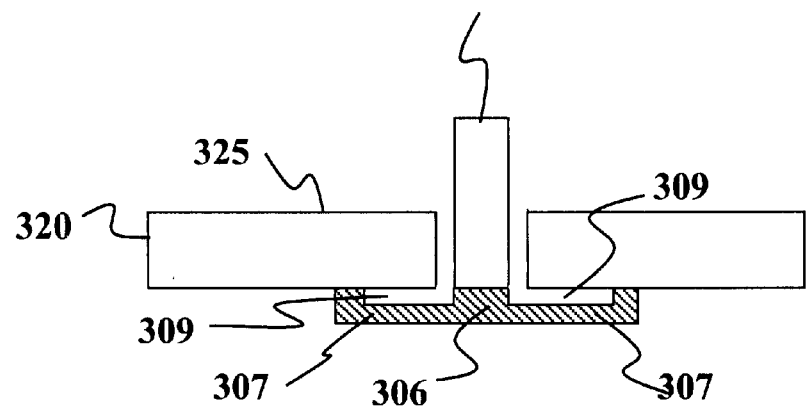

An example of such a fabrication process is shown in the series of cross-sectional schematic diagrams of FIG. 3. The process starts at step 301 by forming a clamping plate 306 and one or more flexures 307 on a first surface 323 of a substrate 320. The substrate 320 may be a crystalline substrate characterized by a set of substrate crystal axes 322. The clamping plate 306 and flexure 307 may be formed from the same material or, alternatively, from different materials. A pattern of sacrificial material 308 may be deposited prior to forming the clamping plate 306 and flexures 307. The sacrificial material is deposited on the first surface 323 in a pattern such that the clamping plate 306 and flexures 307 are only attached to the substrate 320 at specific locations. In step 303 one or more trenches 310 are formed in the substrate to define a perpendicular portion 304 of a moveable element. The perpendicular portion 304 is attached to the substrate 320 by the clamping plate 306 and the flexure 307. It is important during step 303 to protect the perpendicular portion 304 from being etched by the etch process that forms the trenches 310 in the substrate 320. The perpendicular portion 304 and substrate 320 may be protected during this step by a suitably patterned etch-resistant mask (not shown). In step 305 a second surface 325 of the substrate 320 is etched back to expose the perpendicular portion 304. It is important during step 305 to protect the perpendicular portion from being etched by the etch process that attacks the substrate 320. Again, a suitable etch-resistant mask may be formed on the perpendicular portion 304. The perpendicular portion 304 is oriented substantially perpendicular to a plane of the substrate 320. Note that the perpendicular portion 304 is formed from the same material as the substrate and need not be rotated out of plane. Furthermore, if the substrate 320 is a crystalline substrate, the perpendicular portion 304 will be characterized by perpendicular potion crystal axes 342 that substantially align with the substrate crystal axes 322. By appropriate processing the perpendicular portion 304 may be formed with optically smooth sidewalls. The sacrificial material 308 may be removed in a final release step to provide one or more gaps 309 between the second surface 323 and the clamping plate 306 and/or flexures 307.

Figure 4:
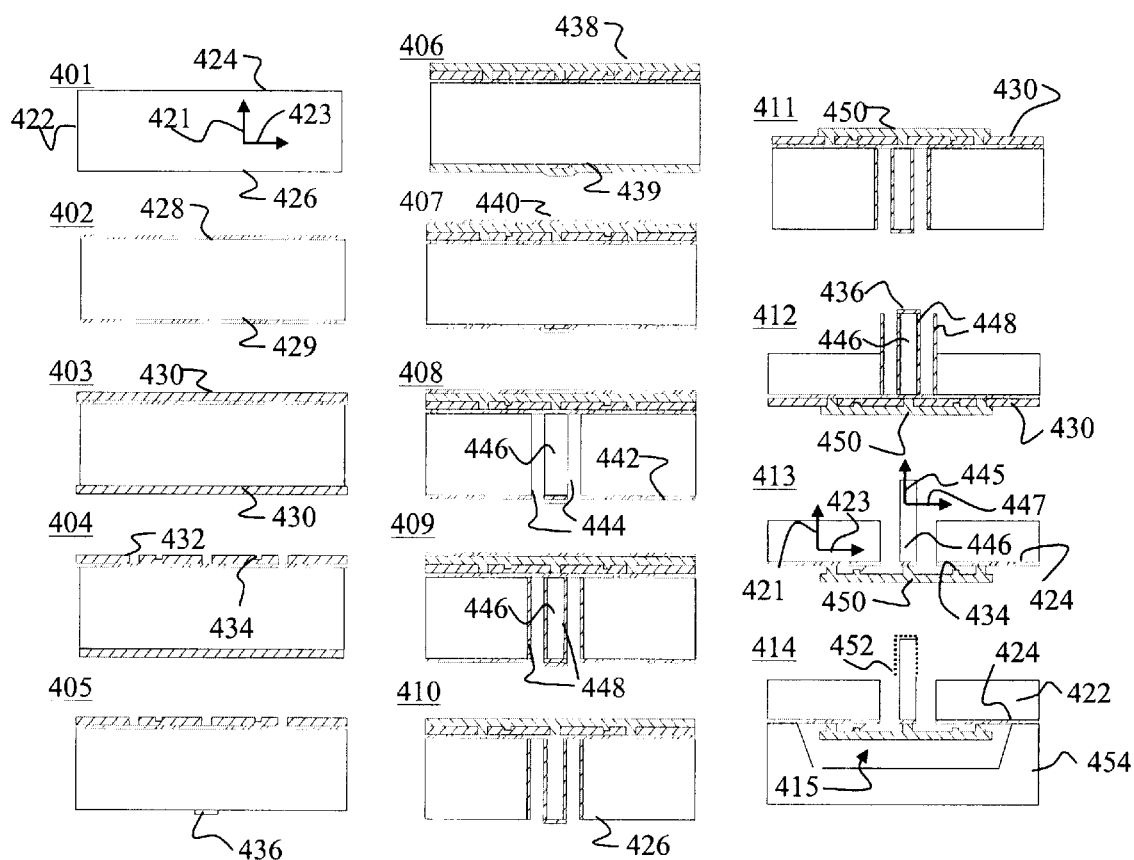
FIG. 4 depicts a series of cross-sectional schematic diagrams illustrating a method of fabricating a MEMS element according to a first alternative version of the third embodiment of the invention.

A more detailed example of such a fabrication process is shown in the series of cross-sectional schematic diagrams FIG. 4. The process starts at step 401 by providing a substrate 422. The substrate has a first surface 424 and a second surface 426. The substrate 422 may be a single crystalline base material, characterized by two or more substrate crystal axes 421, 423. By way of example, the substrate 422 may be a wafer of <110> silicon. First and second etch resistant insulator material layers 428, 429 are deposited on respectively the first and second surfaces 424, 426 of the substrate 422. An example of an etch-resistant insulator material is low stress silicon nitride. Alternatively, the etch-resistant insulator material may be aluminum nitride or silicon carbide.

At step 403, the etch-resistant insulator layer 429 may be removed from the second surface 426 and a sacrificial insulator layer 430 may be deposited on the first and second surfaces of the substrate 422. It is important that the material of sacrificial insulator layer 430 be resistant to an etch process that attacks the bulk material of the substrate 422. An example of a suitable material for the sacrificial insulator layer 430 is silicon dioxide, which is resistant to a KOH etch used to etch silicon. Steps 401, 402 and 403 illustrate only one example of providing a substrate coated with one or more layers of sacrificial material. There are many other ways of achieving this without departing from the scope of the present invention.

In step 404, an etch process opens contact holes 432 through the sacrificial insulation layer 430 on the first surface 424. A second etch process may form shallow dimples 434 on the surface of the sacrificial insulation layer 430 on the first surface 424. In step 405 the sacrificial layer 430 on the second surface 426 is patterned and etched, e.g. by photolithographic process, in such a way as to leave a strip of sacrificial material 436 right below the contact holes 432. For example, if the etch-resistant insulator layer 429 is selective to the bulk etch process, it may be possible to pattern the etch-resistant insulator 429 to form the strip 436 shown in step 405.

At step 406, a conductive layer 438 is deposited over the sacrificial layer 430 on the first surface 424 of the substrate 422. The conductive layer 438 fills the contact holes 432 in the sacrificial insulator layer 430 to attach the conductive layer 432 to the etch-resistant insulator layer 430 on the first surface 424 of the substrate 422. The conductive layer 438 also fills the dimples 434. To form the conductive layer 438, conductive material (e.g. polysilicon) may be deposited simultaneously on both the first surface 424 and the second surface 426 of the substrate 422 and the deposited conductive material may be subsequently stripped from the second surface 426. Alternatively, the conductive material may be deposited on only the sacrificial layer 430 on the first surface 424 to form the conductive layer 438. In step 407 a third etch-resistant insulator layer 440 may be deposited on the first surface 424 and a fourth etch-resistant layer 442 may be deposited on the second surface 426.

During step 408, the etch-resistant insulator layer 442 on the second surface 426 is patterned, and a through-wafer anisotropic etch forms trenches 444 in the substrate 422 to define a perpendicular potion 446 of a moveable element. At step 409 a layer of sacrificial insulating material 448 is formed on the sidewalls of the trenches 444. For example, the substrate 422 may be sent to oxidation furnace to form a layer of oxide on the sidewalls of the trenches 444. It is important that the sacrificial insulator material 448 is resistant to a etch process that etches the material of the substrate 422. At step 410, the etch-resistant insulator layers 440, 442 are removed from the first and second surfaces 424, 426 respectively. At step 411, the conductive material 438 on the first surface 424 is patterned to form a clamping plate 450. The conductive material 438 may also be patterned to form a flexure (not shown) that is attached to the clamping plate 450. An actuator may also be formed on the clamping plate 450 or other portion of the first surface 424 at this time. In step 412 the bulk material of the substrate 422 is etched from the second surface 426 to expose a portion of the perpendicular portion 446 above the second surface 426 of the substrate 422. Note that the, for the purposes of illustration, the substrate has been inverted between steps 411 and 412. The sacrificial insulating material 448 on the sidewalls and the strip of sacrificial material 436 protect the sides and end of the perpendicular portion 446 during the etch process. It is critical that the etch process be selective in that it removes the bulk material from substrate 422 but does not attack the sacrificial insulator material in the layer 448 on the sidewalls or the strip 436. For example, where the substrate 422 is silicon and the sacrificial material is silicon oxide, a wet etch with KOH may used. Alternatively, a dry etch with $XeF_2$ may be used.

At step 413 the remaining sacrificial insulator material is removed, e.g., the layers 448 on the sidewalls of the moveable element, the strip of sacrificial material 436 on the end of the perpendicular portion 446 and any remaining portions of the sacrificial layer 430 on the first surface 424 of the substrate 422. The perpendicular portion 446 and the clamping plate 450 form a moveable element 415. With the removal of the sacrificial layer 430, the moveable element 415 is released and free to move. The perpendicular portion 446 is attached to the susbtrate 422 by the conductive material 450. The filled dimples 434 reduce the contact area between the conductive material and the first surface 424 of the substrate 422, which may help to reduce stiction. Because the perpendicular portion 446 is formed from the substrate 422, the perpendicular portion 446 has substantially the same crystal structure as the substrate 422. In particular the perpendicular portion 446 has crystal axes 445, 447 that align with substrate crystal axes 421, 423 when the moveable element is in the orientation shown.

A few optional steps may be added to complete the actuator. The actual process depends on the design but can be as simple as a metal deposition/lift-off to define contact pads. For example, a light-deflective element 452 may be formed on the perpendicular portion 446. Such a light-deflective element may be any of the types described above. In a particular example, the light-deflective element 452 may be a reflective coating, e.g., gold sputter deposited on the perpendicular portion 446. The substrate 422, with the perpendicular portion 446 may be bonded to a handle wafer 454 as shown in step 414. The handle wafer 454 can be formed using transparent glass wafers with ITO electrodes to improve ease of inspection.

While the above is a complete description of the preferred embodiment of the present invention, it is possible to use various alternatives, modifications and equivalents. For example, a fabrication process similar to that shown in FIGS. 3 and 4 but involving the usage of SOI wafers can be easily implemented. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for making a microelecromechanical systems (MEMS) element comprising:

providing a substrate;

forming one or more trenches in the substrate to define a perpendicular portion of a element; and moveably attaching the moveable element to a first surface of the substrate;

removing a portion of the substrate such that at least a part of the perpendicular portion projects beyond a second surface of the substrate.

2. A MEMS element fabricated by the method of claim 1.

3. The method of claim 1 wherein the substrate is a single crystal substrate.

4. The method of claim 1 wherein the substrate is a silicon on insulator (SOI) substrate.

5. The method of claim 1 wherein the removing step includes protecting the perpendicular portion from attack by a process that removes substrate material.

6. The method of claim 5 wherein the removing step includes protecting one or more sidewalls of the trenches from attack by a process that removes substrate material.

\* \* \* \* \*